United States Patent
Lau

(10) Patent No.: US 12,024,360 B2
(45) Date of Patent: Jul. 2, 2024

(54) ANTI-SLOSHING DEVICE FOR IMMERSION COOLING APPARATUS

(71) Applicant: LiquidStack Holding B.V., Amsterdam (NL)

(72) Inventor: Kar-Wing Lau, Hong Kong (CN)

(73) Assignee: LIQUIDSTACK HOLDING B.V., Amsterdam (NL)

(*) Notice: Subject to any disclaimer, the term of this patent is extended or adjusted under 35 U.S.C. 154(b) by 629 days.

(21) Appl. No.: 17/141,411

(22) Filed: Jan. 5, 2021

(65) Prior Publication Data

US 2021/0206567 A1 Jul. 8, 2021

Related U.S. Application Data

(60) Provisional application No. 62/958,380, filed on Jan. 8, 2020.

(51) Int. Cl.
*B65D 90/52* (2006.01)
*H05K 7/20* (2006.01)

(52) U.S. Cl.
CPC .......... *B65D 90/52* (2013.01); *H05K 7/20236* (2013.01)

(58) Field of Classification Search
CPC ........ B60K 15/077; B60K 2015/07755; B65D 90/52; H05K 7/20327
See application file for complete search history.

(56) References Cited

U.S. PATENT DOCUMENTS

| | | | | |
|---|---|---|---|---|
| 2,678,660 A | * | 5/1954 | Gurin | B64D 37/005 220/563 |
| 6,568,556 B1 | | 5/2003 | Kahler, Jr. et al. | |
| 2004/0219665 A1 | * | 11/2004 | Trammel, II | C12M 23/24 435/305.4 |

FOREIGN PATENT DOCUMENTS

| | | |
|---|---|---|
| DE | 1297539 B | 6/1969 |
| JP | S5562997 U | 4/1980 |
| JP | H08101296 A | 4/1996 |
| JP | 4233497 B2 | 3/2009 |
| JP | 4295248 B2 | 7/2009 |
| JP | 2009216538 A | 9/2009 |
| JP | 4676801 B2 | 4/2011 |
| JP | 2017047957 A | 3/2017 |

OTHER PUBLICATIONS

International Search Report and Written Opinion in PCT/EP2021/050205, dated Mar. 29, 2021 15 pages.

* cited by examiner

*Primary Examiner* — Andrew T Kirsch

(57) ABSTRACT

An immersion cooling system for cooling an object in an immersion cooling tank including an anti-sloshing device adapted to be attached to or attachable to (e.g., an inner surface of) the immersion cooling tank, the device including a connecting device(s), a first plate fixedly attached to or rotatably attached to the connecting device, and a second plate rotatably attached to the connecting device.

19 Claims, 16 Drawing Sheets

ANTI-SLOSHING DEVICE FOR IMMERSION COOLING APPARATUS

CROSS-REFERENCE TO RELATED APPLICATIONS

This application claims priority to and the benefit of U.S. Provisional Patent Application Ser. No. 62/958,380 filed Jan. 8, 2020, the disclosure of which is incorporated herein by reference in its entirety.

FIELD OF THE INVENTION

The present invention relates to immersion cooling equipment, and, more specifically, to immersion cooling tanks equipped with an anti-sloshing device.

BACKGROUND OF THE INVENTION

Immersion cooling is a cooling technique for computer systems, electronic devices, and the like. by which IT components and other electronics, including complete servers, are submerged in a thermally-conductive, dielectric liquid or coolant known as a heat transfer fluid. Heat generated by the IT components may be removed from the system by conduction, by circulating the heat transfer fluid into direct contact with hot components, then through cooling heat exchangers. Immersion cooling has the potential of becoming a popular IT cooling solution as it allows operators to drastically reduce energy usage through the elimination of an expensive air cooling infrastructure, including on-board fans, compressors, necessary duct work, and other active ancillary systems such as dehumidifiers.

Typically, with the immersion cooling systems, electronics are placed inside an immersion cooling tank while heat transfer fluid covers the heat-generating area of electronics in order to ensure effective heat removal. Disadvantageously, heat transfer fluid escape and loss from the immersion cooling tank may expose the IT components submerged in the heat transfer fluid to harmful or dangerous conditions. As a result, IT components in an immersion cooling system may be susceptible to damage during an earthquake or transportation. Indeed, more particularly, movement or external forces that produce vibrations of large amplitude and having frequency components matching certain immersion cooling tank physical characteristics may result in effective transfer of vibration energy known as resonance. Were this to occur, heat transfer fluid inside the tank may fluctuate with a large amplitude, which is known as sloshing. When sloshing occurs, some portions of the IT components may temporarily not be covered by the heat transfer fluid that provides continuous cooling. When the IT components are so exposed and uncovered, the heat removal effectiveness may be reduced, which may result in thermal runaway, damage, or destruction of IT components, which is undesirable.

One method to counter this is to increase the liquid level of heat transfer fluid above the IT components, such that, even during sloshing, the IT components remain completely or substantially completely submerged in the sloshing heat transfer fluid. Raising the level of the heat transfer fluid, however, may increase the cost of the immersion cooling system, as, in some instances, heat transfer fluid can be very expensive. Furthermore, if the amplitude and resonance of an earthquake or other applied force to the immersion cooling tank is large enough, sloshing may still occur.

Another traditional method to minimize the likelihood of exposing IT components during a sloshing-producing event is to immediately or rapidly shut down the system during any critical circumstances. However, such a response may result in a loss of productivity and/or potential data loss, which are also undesirable consequences.

Conventional methods for preventing sloshing in connection with fossil fuel and petroleum storage tanks may include providing a floating roof mechanism that rises and falls with the liquid level inside the fossil fuel and petroleum storage tanks. Disadvantageously, a floating roof mechanism covers the surface of the heat transfer fluid, preventing dielectric vapors from leaving the liquid surface properly and, thereby, obstructing the heat transfer process. Other conventional methods may include using a baffle system to remove the energy from the sloshing fluids.

SUMMARY OF THE INVENTION

Accordingly, it would be desirable to provide an apparatus that suppresses the effect of sloshing on the heat transfer fluid inside the immersion cooling tank and on the IT components therein, e.g., during an earthquake, transportation, or other occurrence that may apply a force to the immersion cooling tank and heat transfer fluid contained therein. Moreover, it would be desirable to maximize the space available within the immersion cooling tank. Accordingly, one purpose of the invention is to provide an immersion cooling device or system that includes an immersion cooling tank equipped with an anti-sloshing device.

In a first aspect, the present invention relates to an immersion cooling system for cooling an object in an immersion cooling tank. In some embodiments, the system includes an anti-sloshing device that is adapted to be attached to (e.g., an inner surface of) the immersion cooling tank. In some applications, the device includes a connecting device(s) first plate fixedly attached to or rotatably attached to the connecting device, and a second plate rotatably attached to the connecting device. In some variations, the anti-sloshing device includes a combination of devices that each include the connecting device(s), the first plate fixedly attached to or rotatably attached to the connecting device, and the second plate rotatably attached to the connecting device.

In some applications, openings may be formed through the first plate and/or the second plate. The shapes of the openings may include circular, substantially circular, elliptical, oval, rectangular, rounded rectangular, square, and combinations thereof. In still other applications, the system may include a stopping device to limit it rotation of at least the first plate.

In some implementations, the system also includes a curved portion attached to or formed by the first plate and/or the second plate. In some variations, the first plate and the second plate are each attached to the connecting device at a respective proximal end and the curved portion is disposed at a respective distal end of the first plate and/or the second plate.

In some embodiments, the second plate is rotatable and further adapted to touch the first plate when an external force is applied to the second plate. In some variations, the second plate is adapted to touch the first plate when the external force applied exceeds a threshold.

In a second aspect, the present invention relates to an immersion cooling tank having an inner surface and adapted to contain a heat transfer fluid for cooling an object. In some embodiments, the immersion cooling tank includes an anti-sloshing device adapted to be attached to (e.g., the inner surface of) the immersion cooling tank. In some applications, the device includes a connecting device(s) a first plate fixedly attached to or rotatably attached to the connecting device, and a second plate rotatably attached to the connecting device. In some variations, the anti-sloshing device includes a combination of devices that each include the connecting device(s), the first plate fixedly attached to or rotatably attached to the connecting device, and the second plate rotatably attached to the connecting device.

In some applications, openings may be formed through the first plate and/or the second plate. The shapes of the openings may include circular, substantially circular, elliptical, oval, rectangular, rounded rectangular, square, and combinations thereof. In still other applications, the system may include a stopping device to limit rotation of at least the first plate.

In some implementations, the system also includes a curved portion attached to or formed by the first plate and/or the second plate. In some variations, the first plate and the second plate are each attached to the connecting device at a respective proximal end and the curved portion is disposed at a respective distal end of the first plate and/or the second plate.

In some embodiments, the second plate is rotatable and further adapted to touch the first plate when an external force is applied to the second plate. In some variations, the second plate is adapted to touch the first plate when the external force applied exceeds a threshold.

In a third aspect, the present invention relates to method of minimizing sloshing of a heat transfer fluid in an immersion cooling tank, the method including attaching an anti-sloshing device to (e.g., an inner surface of) the immersion cooling tank and filling the immersion cooling tank with heat transfer fluid to a predetermined level. In some embodiments the anti-sloshing device includes a connecting device(s), a first plate fixedly attached to or rotatably attached to the connecting device, and a second plate rotatably attached to the connecting device. In some variations, the predetermined level is at or below the attached anti-sloshing device.

BRIEF DESCRIPTION OF THE DRAWINGS

In the drawings, like reference characters generally refer to the same parts throughout the different views. But, for the purpose of clarity, not every component may be labeled in every drawing. Also, the drawings are not necessarily to scale, emphasis instead generally being placed upon illustrating certain principles of the invention. In the following description, various embodiments of the present invention are described with reference to the following drawings, in which.

DETAILED DESCRIPTION OF THE INVENTION

Immersion Cooling System

Figure 1:
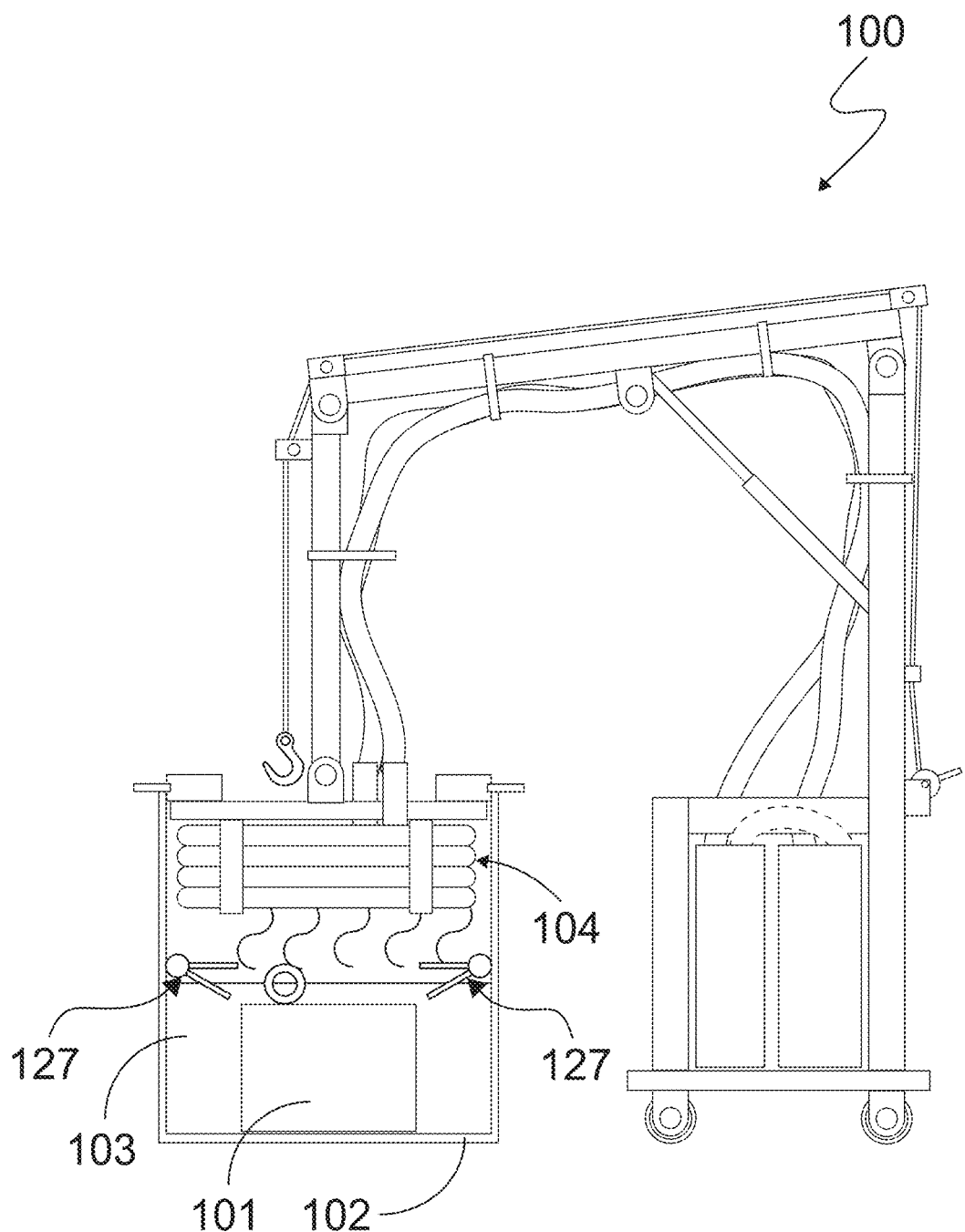
FIG. 1 depicts a side view of an immersion cooling system having an anti-sloshing device, in accordance with some embodiments of the present invention.
Figure 2:
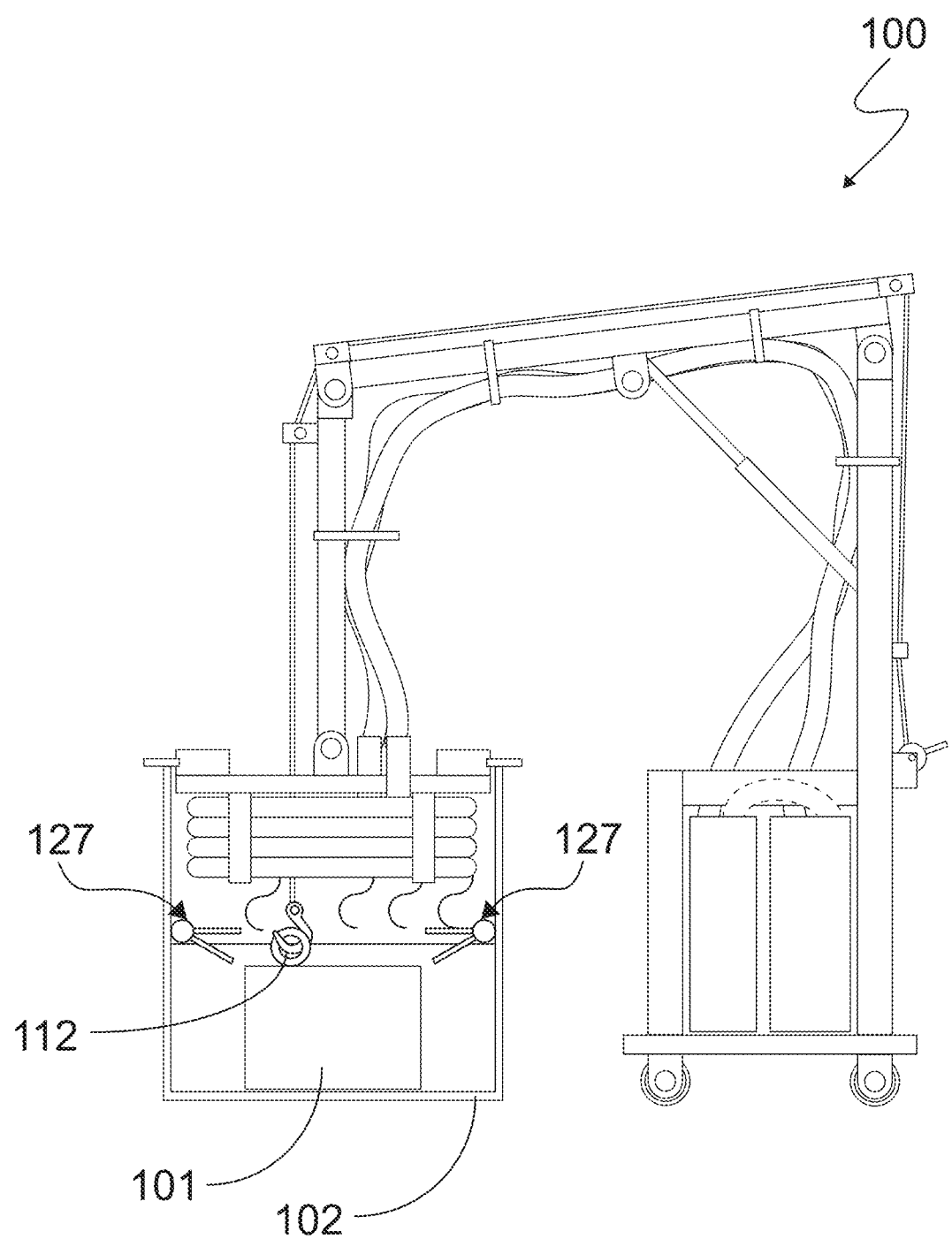
FIG. 2 depicts a side view of the immersion cooling system of FIG. 1 with a lifting device attached to an object submerged in the immersion cooling tank, in accordance with some embodiments of the present invention.
Figure 3:
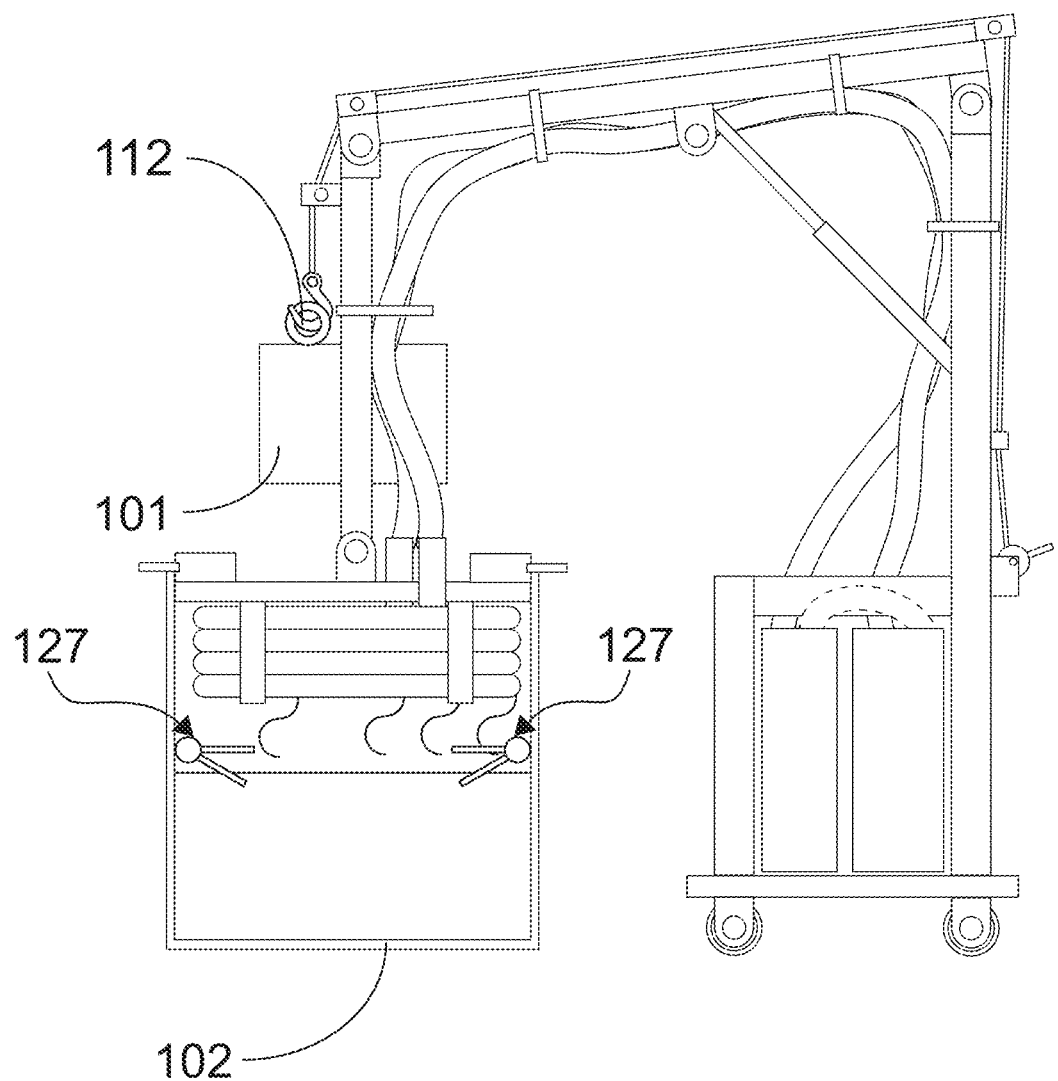
FIG. 3 depicts a side view of the immersion cooling system of FIG. 1 with a lifting device attached to an object that has been raised out of the immersion cooling tank, in accordance with some embodiments of the present invention.

FIGS. 1 to 3 depict illustrative embodiments of a system 100 for immersion cooling of an object 101, e.g., electronic or electric equipment or device, and the like, during various stages of operation. Such systems are described in U.S. patent application Ser. No. 16/683,958 entitled "Hot Swap Condensor for Immersion Cooling" and filed on Nov. 14, 2019, which is incorporated herein in its entirety by reference. More particularly, FIG. 1 shows the system 100 with the object 101 located in or submerged within an immersion cooling tank 102 containing a bath of a heat transfer fluid 103. FIG. 2 shows the system 100 in which a lifting/lowering device 112 is attached to the submerged object 101. FIG. 3 shows the system 100 in which a lifting/lowering device 112 has extracted the object 101 from the immersion cooling tank 102.

In some embodiments, the system 100 may include an immersion cooling tank 102 capable of retaining a volume of heat transfer fluid 103, in which one or more, e.g., heat-generating, objects 101 (e.g., electronic or electric systems or devices and the like) may be immersed or submerged. In some implementations, the system 100 may include a condensing device 104 that may be selectively inserted into and/or removed from the immersion cooling tank 102, while in other implementations, as depicted in FIG. 1, the condensing device 104 may be immovably fixed to the tank 102.

Figure 4:
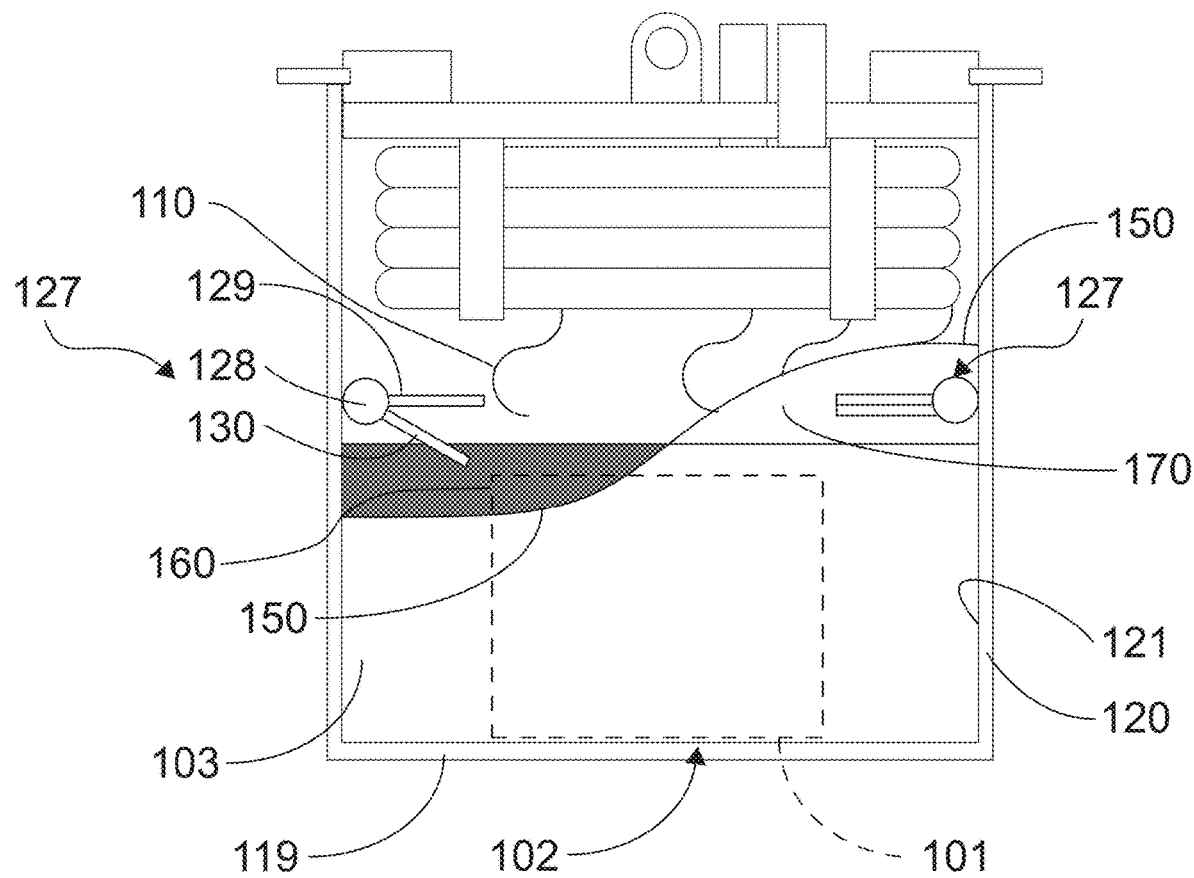
FIG. 4 depicts a side view of an immersion cooling tank equipped with an anti-sloshing device during a sloshing-producing event, in accordance with some embodiments of the present invention.
Figure 5:
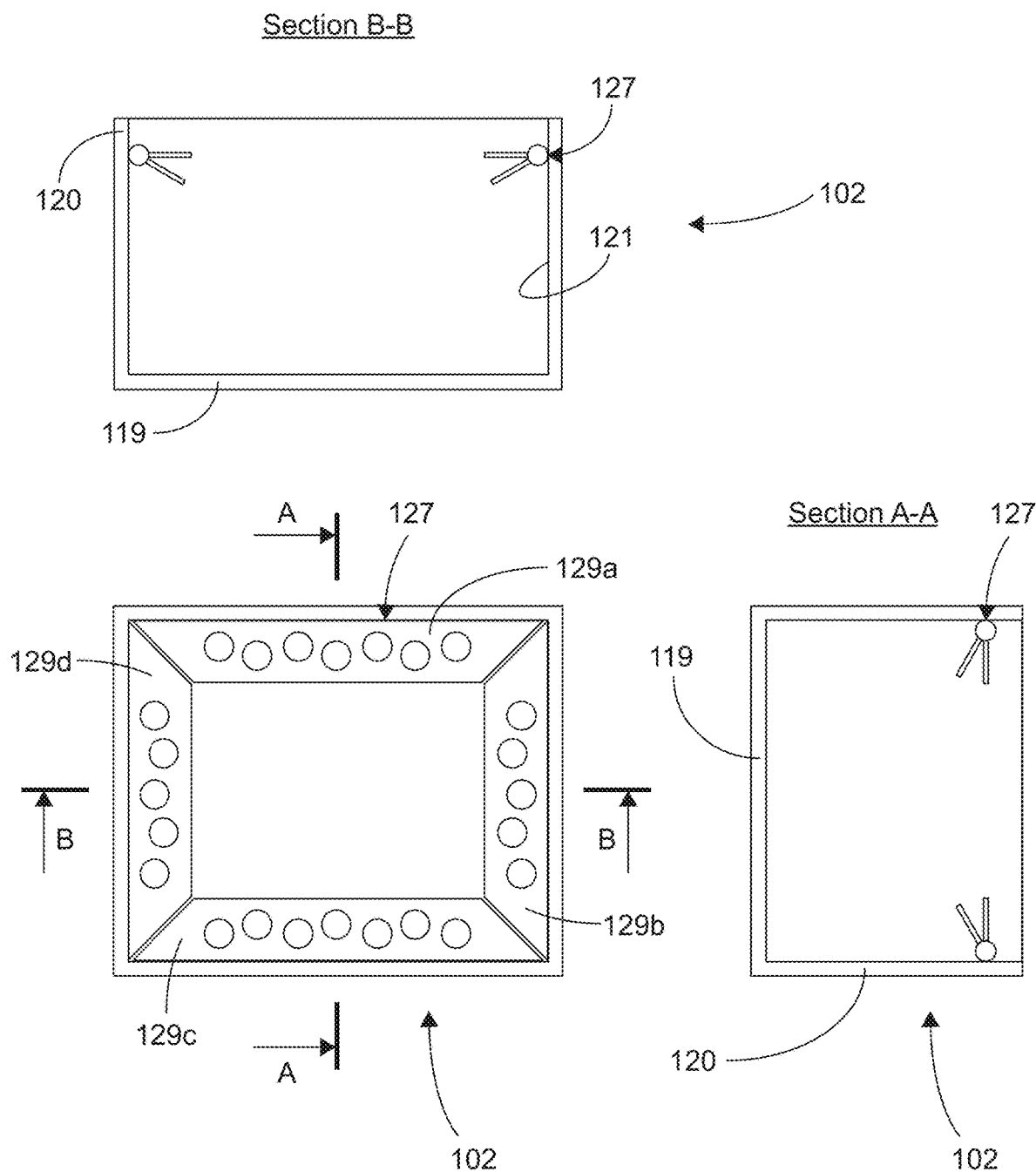
FIG. 5 depicts a plan (top) view of an anti-sloshing device coupled to a rectangular-shaped immersion cooling tank, including sectional views A-A and B-B, in accordance with some embodiments of the present invention.

An illustrative embodiment of an immersion cooling tank 102 equipped with at least one anti-sloshing device 127 coupled, attached, affixed, adhered, or the like to the inner surface 121 of the sidewall portion 120 of the immersion cooling tank 102 is depicted in FIG. 4. Although an embodiment of the invention will be described in which the anti-sloshing device 127 may be permanently or fixedly coupled, attached, affixed, adhered, or the like to the inner surface 121 of the sidewall portion 120, those of ordinary skill in the art can appreciate that the anti-sloshing device 127, in the alternative, may be removably attachable to the sidewall portion 120 using, for example, a device, to which an anti-sloshing device 127 may be attached, that may be placed over and removed from the rim of the immersion cooling tank 102. In some embodiments, the immersion cooling tank 102 may include a bottom portion 119 that is, e.g., hermetically, sealed to the sidewall portion 120. The two portions 119, 120 form the inner surface 121. In various embodiments, the sidewall portion 120 of the immersion cooling tank 102 may have a single, continuous wall or, in the alternative, several sidewall portions 120 may be joined together (e.g., at a corner). For example, as shown in FIGS. 5 and 6, the shape or cross-section of the immersion cooling tank 102 may be square (e.g., FIG. 5), circular (FIGS. 6A and 6C), substantially circular, elliptical, substantially elliptical, and so forth.

As a result, due to the shape of the immersion cooling tank 102, the anti-sloshing device 127 may be structured and arranged as a continuous or unitary device capable of circumscribing a single, continuous wall (e.g., of a circular tank) or as a combination of a plurality of portions that, individually and collectively, perform the anti-sloshing function. Indeed, the anti-sloshing device 127 may be employed in arrays of different shapes and arrangements to prevent sloshing from multiple directions.

Anti-Sloshing Device

Referring to FIG. 4, in some applications, the anti-sloshing device 127 may be coupled, attached, affixed, adhered, or the like to the inner surface 121 of the immersion cooling tank 102. In some variations, the anti-sloshing device 127 may include at least one connecting device 128 (e.g., a hinge) that is physically coupled, attached, affixed, adhered, or the like to the inner surface 121 of the immersion cooling tank 102, as well a first (e.g., fixed or rotatable) plate 129, and a second (e.g., rotatable) plate 130. In some variations, the first and second plates 129, 130 may be implemented with metal; however, the plates 129, 130 may be implemented with any material that is physically and chemically compatible with the heat transfer fluid 103 used in the immersion cooling tank 102.

Although the invention will be described such that the first plate 129 is structured and arranged to be rigidly fixed (i.e., in a non-rotating relationship) to the connecting device 128, while the second plate 130 is adapted to be capable of rotating about the connecting device 128, those of ordinary skill in the art can appreciate that, in other implementations, both plates 129, 130 may be structured and arranged to rotate about the connecting device 128 and/or both plates 129, 130 may be fixedly attached to the connecting device 128 at a desired or predetermined angle, such that neither plate 129, 130 is capable of rotating about the connecting device 128. Furthermore, although the figures show plates 129, 130 that are rectangular in shape, this is done for the purpose of illustration rather than limitation. Those skilled in the art can appreciate that the plates 129, 130 may be manufactured in any arbitrary shape and size.

In some implementations, the first plate 129 and the second, rotatable plate 130 may be coupled to the sidewall portion 120 of the immersion cooling tank 102 by the connecting device 128 (e.g., via a hinge). Although the drawings show a hinge-like connecting device 128 and the invention is described as having such, that is done for the purpose of illustration rather than limitation. In some applications, the device 127 may include a first plate 129 and a perforated second plate 130, which are fixedly connected (e.g., at a fixed angle) without the need for a rotating hinge. As shown in FIGS. 7-13, in some implementations, the device 127 may include a (e.g., fixed angle) limiting pin 134 that is fixedly attached to the connecting device 128. Preferably, the limiting pin 134 is fixedly attached to a portion of the connecting device 128 that rotates with the second plate 130. In some variations, as shown in FIG. 11B, the limiting pin 134 may be a (e.g., fixed angle) limiting pin 134 that is structured and arranged to provide a desired or predetermined angle between the first plate 129 and the second plate 130. Although a single, cylindrical limiting pin 134 is shown in FIGS. 7-13, this is done for the purpose of illustration rather than limitation. Those of ordinary skill in the art can appreciate that a plurality of limiting pins 134 of any reasonable shape and size may be fixedly attached to the connecting device 128 to limit rotation or further rotation of the first plate 129 and second plate 130.

The connecting device 128 may be constructed or manufactured, such that the first plate 129 and the second plate 130 are separated from each other by a desired or predetermined (e.g., acute) angle, that may only be changed by applying a force (e.g., the force of sloshing heat transfer fluid) to one or more of the plates 129, 130. Furthermore, the second plate 130 may be adjusted to conjoin with the first plate 129 when a force applied to the second plate 130 exceeds a certain threshold. For example, when a force of a certain magnitude is applied to portions of the anti-sloshing device 127, the force may cause the second plate 130 to rotate about the connecting device 128 until the second plate 130 touches or otherwise comes into physical contact with the first plate 129, causing the first plate 129 and the second plate 130 to conjoin.

FIG. 5 illustrates an exemplary embodiment in which a group of four trapezoid-shaped 129a, 129b, 129c, 129d anti-sloshing devices 127 have been installed on the sidewall portions 120 of a rectangular-shaped tank 102. The arrangement with each group 129a, 129b, 129c, 129d on each side of the rectangular-shaped tank 102 diminishes sloshing 150 in different directions. For example, the groups 129b, 129d installed on the left and right sidewalls 120 of the immersion cooling tank 102 resist sloshing 150 in the left/right direction. The groups 129a, 129c installed on front and back sidewalls 120 of the immersion cooling tank 102 resist sloshing 150 in the front/back direction.

Figure 6A:
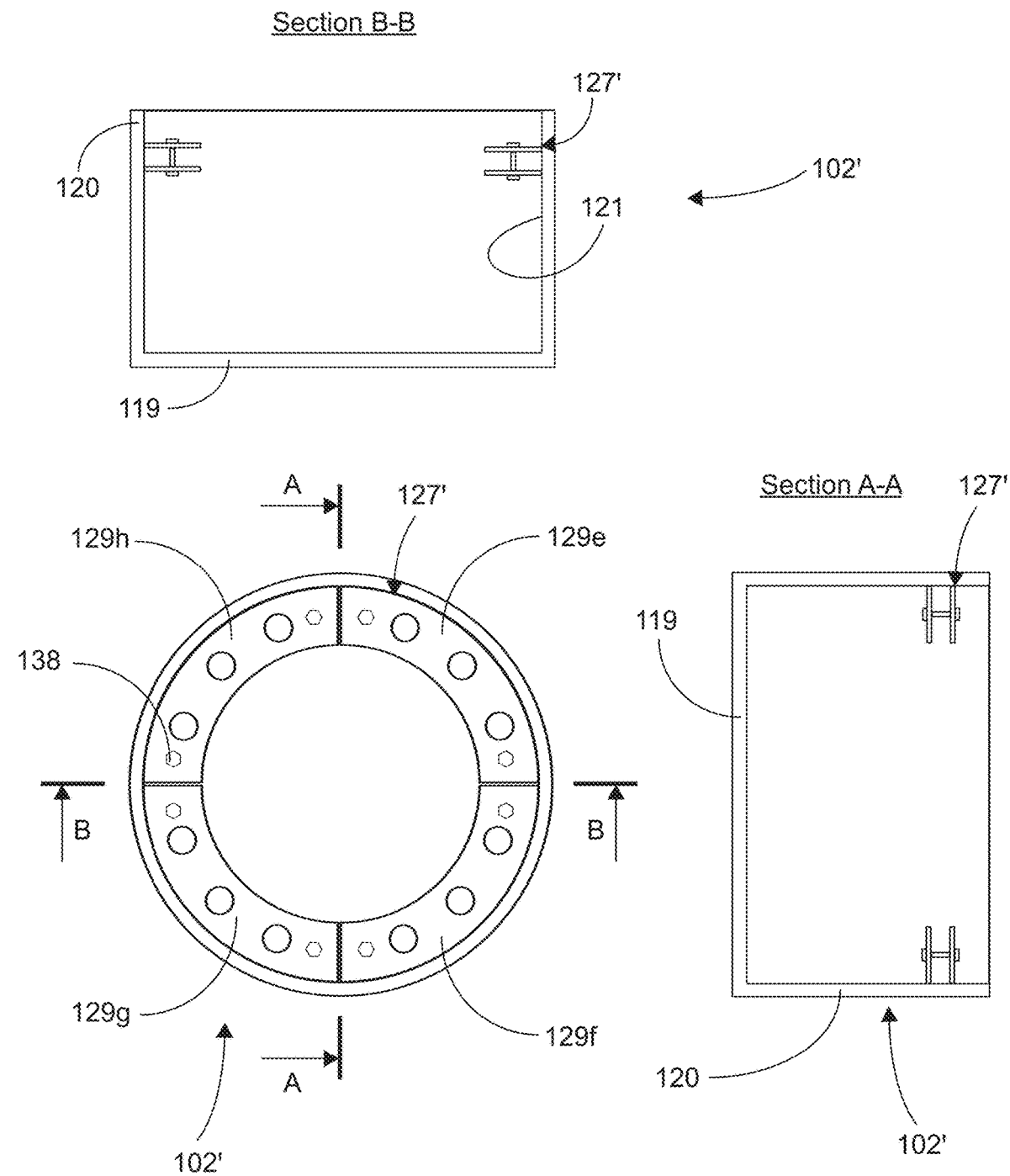
FIG. 6A depicts a plan (top) view of a first embodiment of an anti-sloshing device coupled to a circular-shaped immersion cooling tank, including sectional views A-A and B-B, in accordance with some embodiments of the present invention.

FIG. 6A illustrates an exemplary embodiment in which a group of four arc-shaped 129e, 129f, 129g, 129h anti-sloshing devices 127' have been installed on the sidewall portions 120 of a circular immersion cooling tank 102' (e.g., along a short portion of the arc-shaped edge). The arrangement with each group 129e, 129f, 129g, 129h on one-quarter of the circular tank 102' allows the embodiment to deal with sloshing 150 from all directions effectively.

Figure 6B:
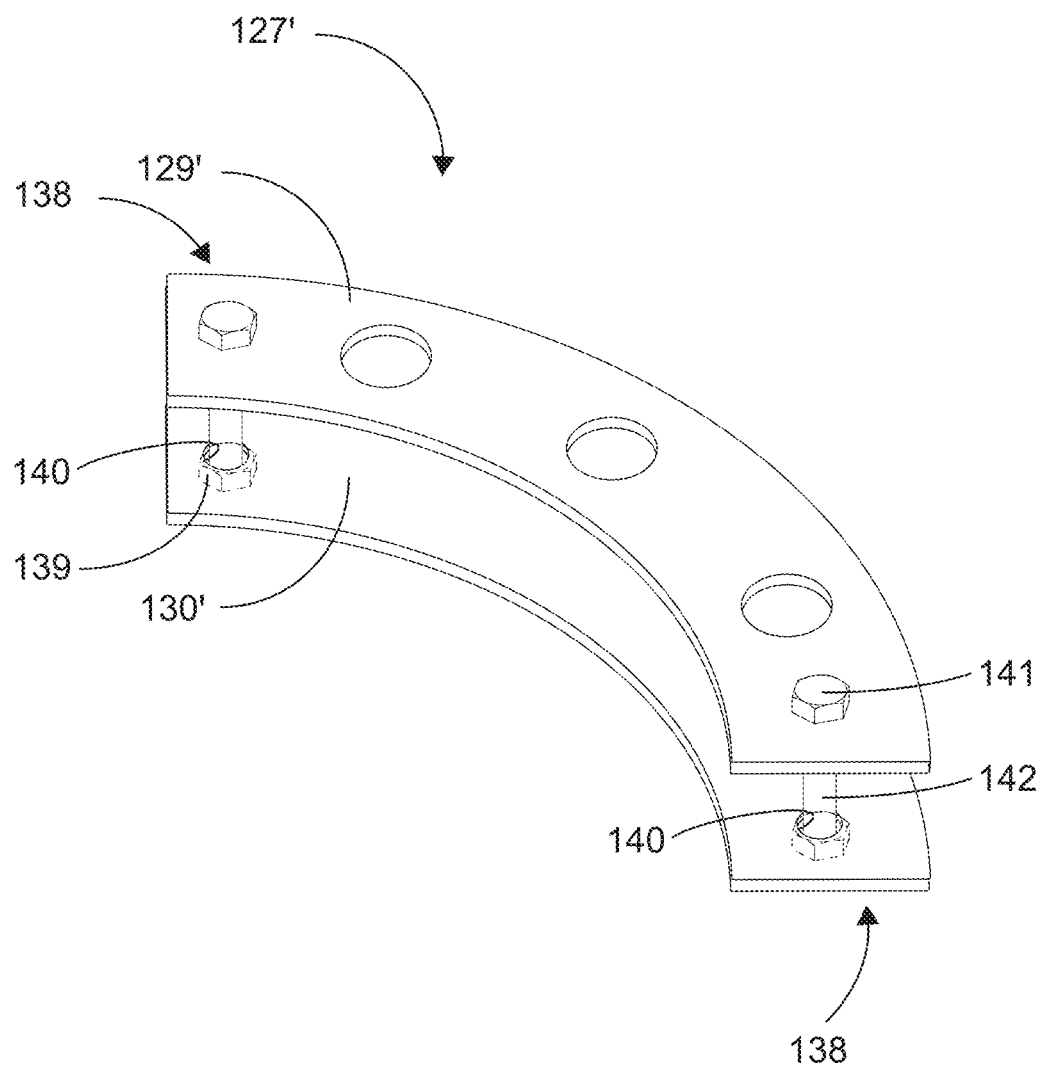
FIG. 6B depicts an (top) isometric view of one of the arc-shaped groups of anti-sloshing devices from FIG. 6A, in accordance with some embodiments of the present invention.

FIG. 6B illustrates how each group 129e, 129f, 129g, 129h of the arc-shaped the anti-sloshing devices 127' shown in FIG. 6A works. In one embodiment, an arc-shaped first plate 129' is vertically linear coupled to an arc-shaped second plate 130' (e.g., using a pair of bolts 138 and nuts 139 operatively disposed in respective openings 140 disposed at opposing distal and proximal ends of the plates 129', 130'. Advantageously, the heads 141 of each of the bolts 138 may be rigidly mounted (e.g., welded, soldered, adhered, and so forth) to (e.g., the upper surface of) the first plate 129'. The nuts 139 may be removably attached to each bolt 138 and are adapted to support the second plate 130', such that the bolt 138 is retained in the opening 140. Advantageously, the second plate 130' is freely translatable in a vertical direction (e.g., along the longitudinal axis of the shaft 142 of the bolt 138), such that when a force (e.g., from sloshing heat transfer fluid 150) is applied to the second plate 130', the second plate 130' is configured to translate up the shaft 142 of the bolt 138 until the second plate 130' contacts the first plate 129'.

In some variations, the second plate 130' may be adapted to conjoin with the first plate 129' when a force applied to the second plate 130' exceeds a certain threshold. For example, when a force of a certain magnitude is applied to portions of the anti-sloshing device 127', the force may cause the second plate 130' to translate up the shaft 142 of the bolt 138 until the second plate 130' touches or otherwise comes into physical contact with the first plate 129', causing the first pate 129' and the second plate 130' to conjoin.

In the absence of a driving force to push the second plate 130' towards the first plate 129', gravity will separate the second plate 130' from the first plate 129', returning the second plate 130' to its original or at-rest position.

Although the figures show plates 129', 130' that are arc-shaped, this is done for the purpose of illustration rather than limitation. Those skilled in the art can appreciate that the plates 129', 130' arranged using bolts 138 may be manufactured in any arbitrary shape and size and, thus, can be used in combination with circular, rectangular, or other arbitrary shaped immersion cooling tanks 102'.

Figure 6C:
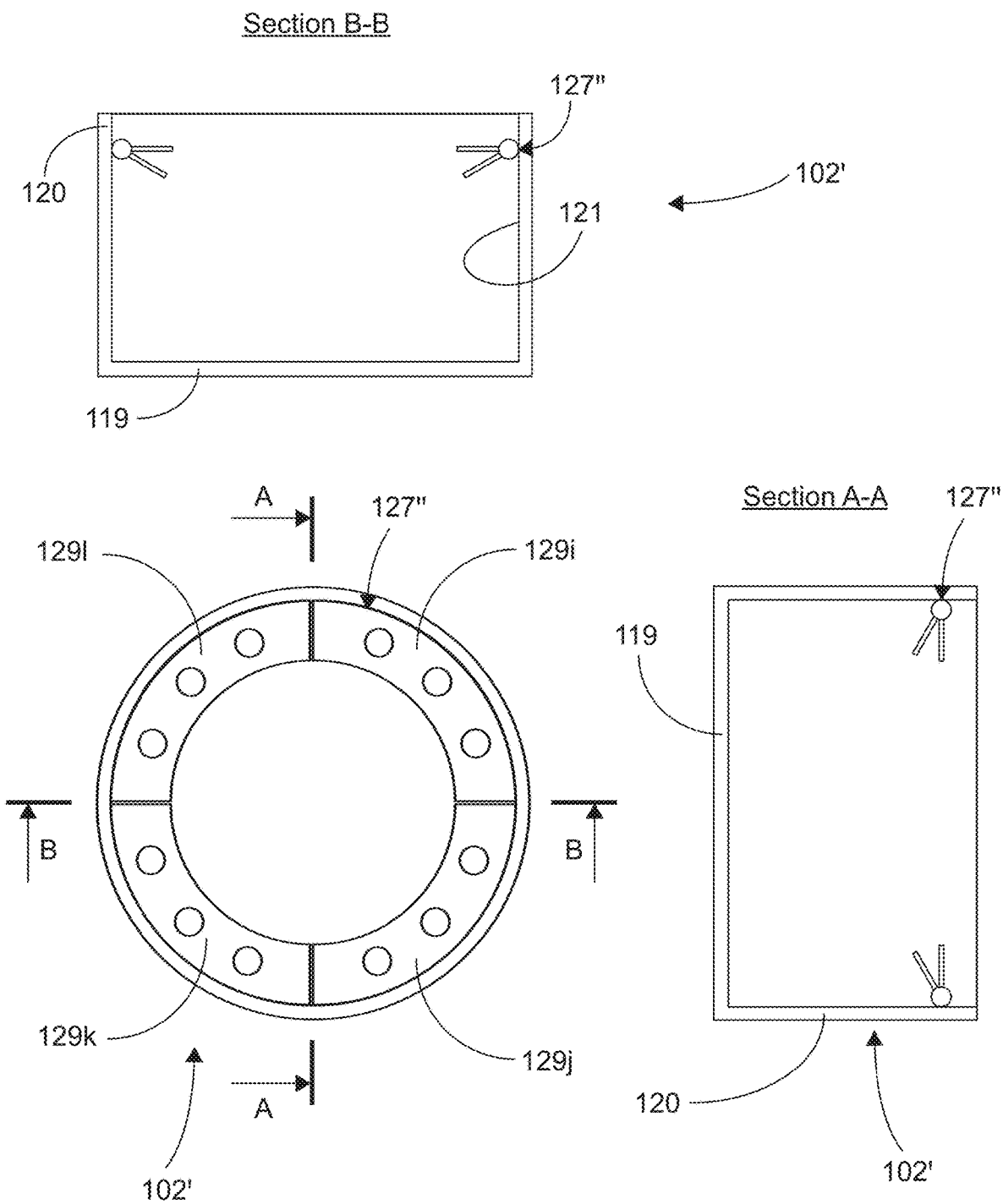
FIG. 6C depicts a plan (top) view of a second embodiment of an anti-sloshing device coupled to a circular-shaped immersion cooling tank, including sectional views A-A and B-B, in accordance with some embodiments of the present invention.
Figure 6D:
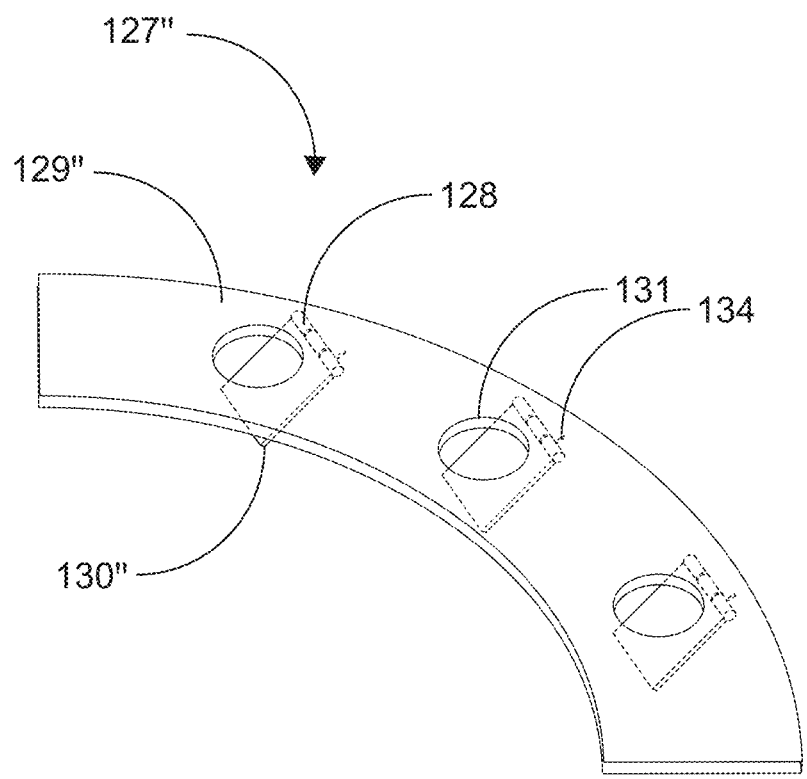
FIG. 6D depicts an (top) isometric view of one of the arc-shaped groups of anti-sloshing devices from FIG. 6C, in accordance with some embodiments of the present invention.
Figure 7:
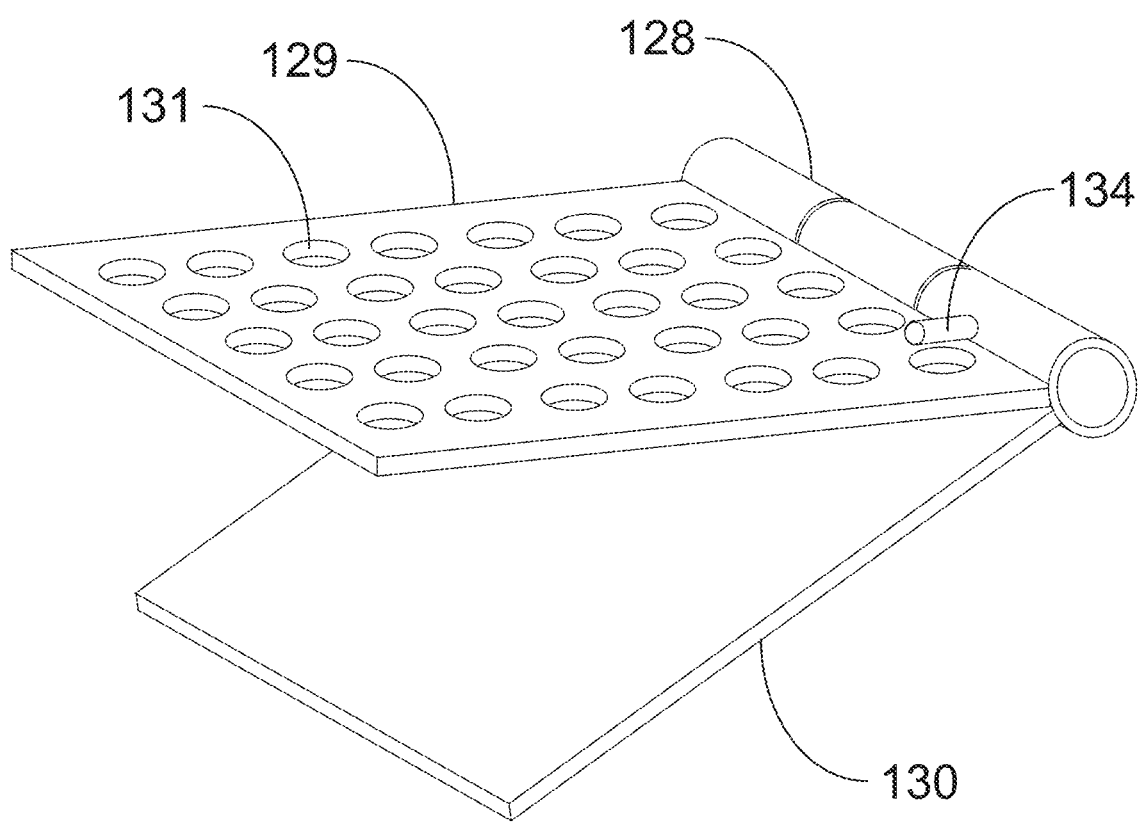
FIG. 7 depicts an isometric view of an anti-sloshing device with circular perforations formed in a first plate, in accordance with some embodiments of the present invention.
Figure 8:
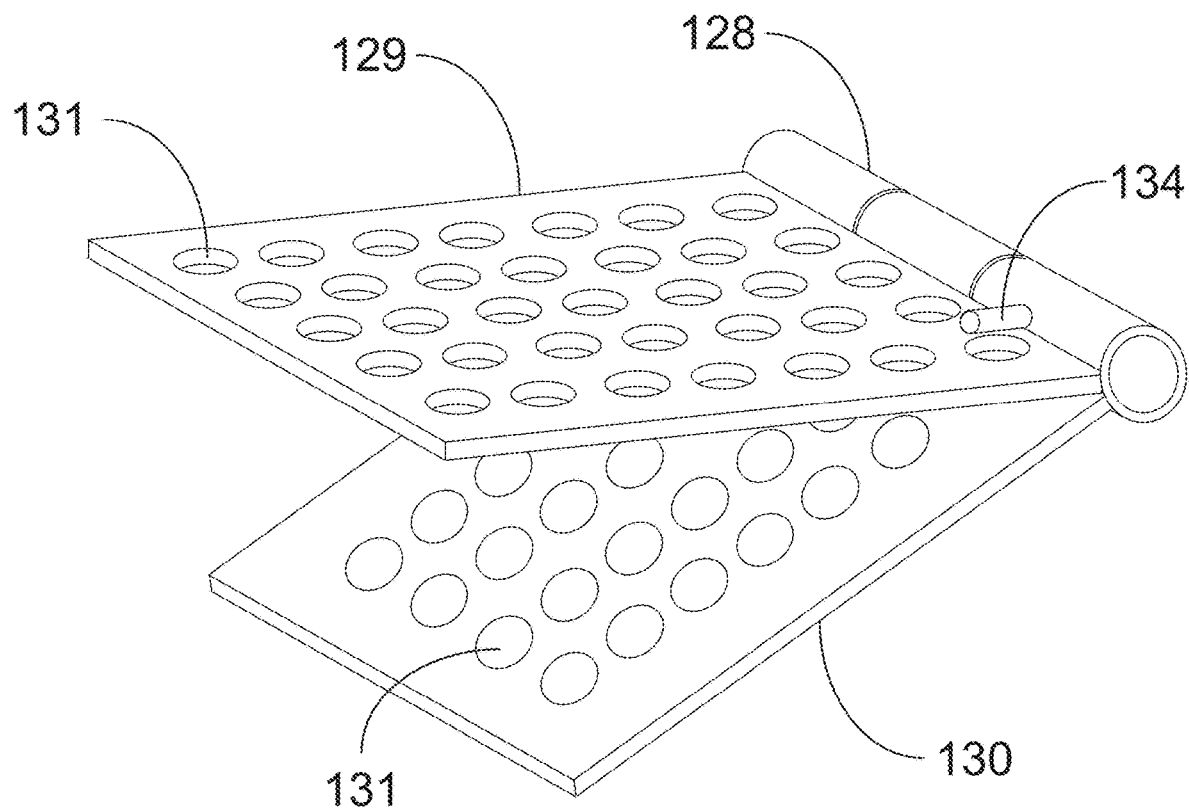
FIG. 8 depicts an isometric view of an anti-sloshing device with circular perforations formed in both a first plate and a second plate, in accordance with some embodiments of the present invention.
Figure 9:
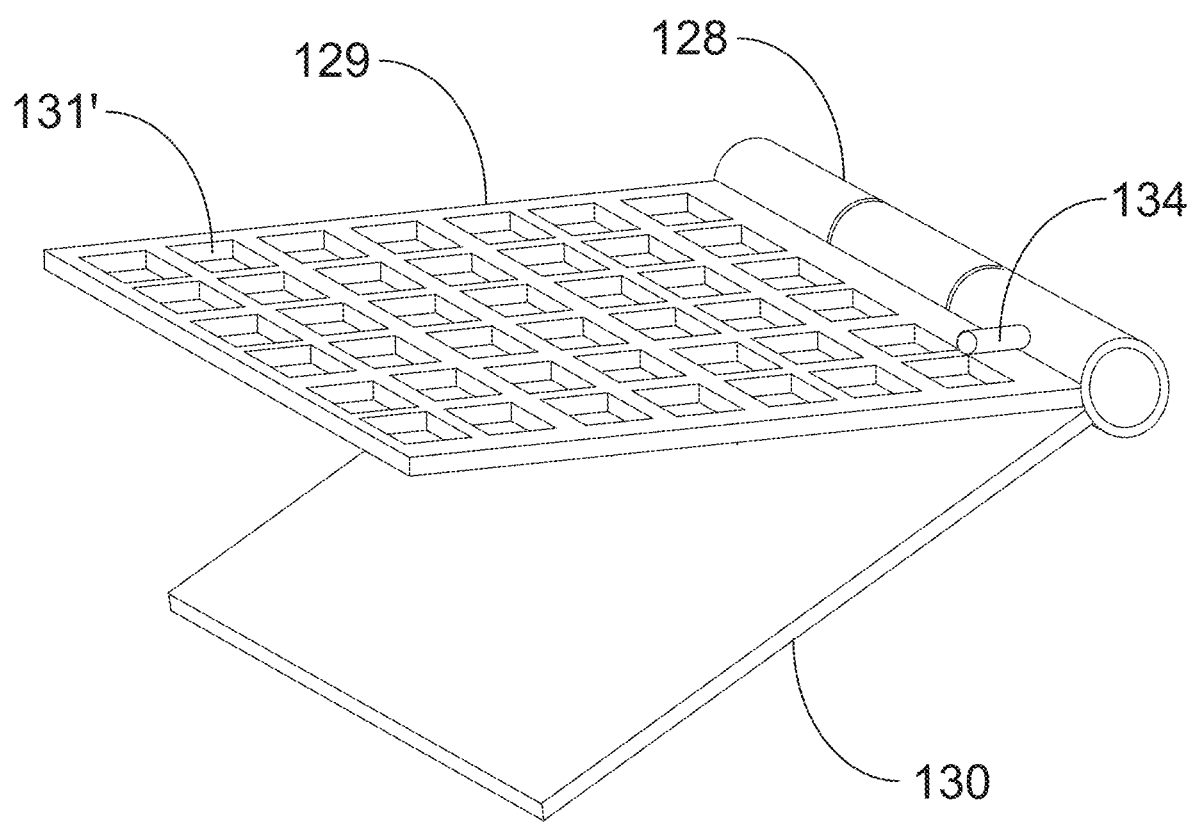
FIG. 9 depicts an isometric view of an anti-sloshing device with rectangular perforations formed in a first plate, in accordance with some embodiments of the present invention.
Figure 10:
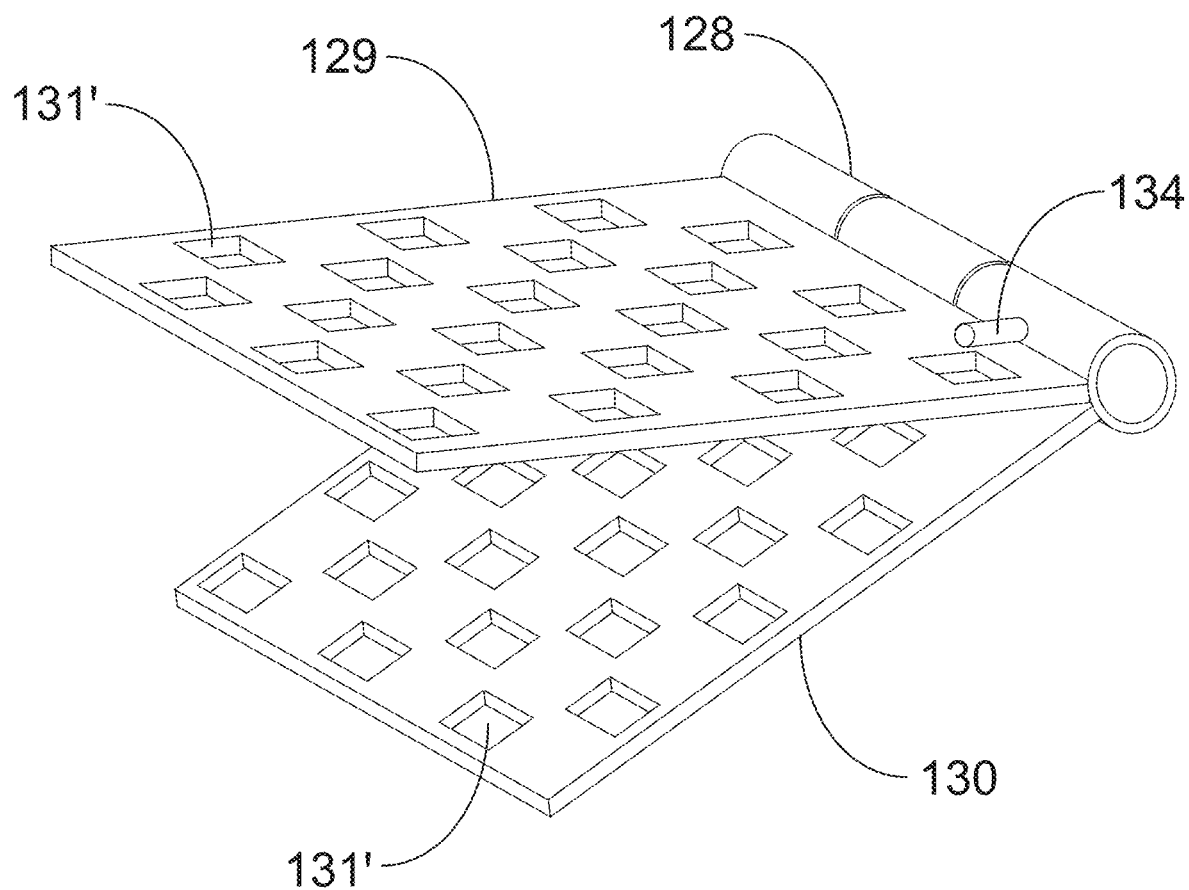
FIG. 10 depicts an isometric view of an anti-sloshing device with rectangular perforations formed in a both a first plate and a second plate, in accordance with some embodiments of the present invention.

FIG. 6C illustrates an alternative embodiment in which a group of four arc-shaped 129i, 129j, 129k, 129l anti-sloshing devices 127" has been installed on the sidewall portions 120 of a circular immersion cooling tank 102' (e.g., along a short portion of the arc-shaped edge). The arrangement with each portion of the group 129i, 129j, 129k, 129l on one-quarter of the circular tank 102' allows the embodiment to deal with sloshing heat transfer fluid 150 from all directions effectively. FIG. 6D illustrates how, in some implementations, each arc-shaped portion 129i of the anti-sloshing device 127" works. For example, the anti-sloshing device 127" may include an arc-shaped first plate 129i having a plurality of openings or perforation 131 formed through the first plate 129i. Beneath each opening or perforation 131, one or more (e.g., rectangular-shaped) second plates 130" may be fixedly attached to the underside of the first plate 129i (e.g., using at least one corresponding connecting device(s) 128). Optionally, the device 127" may include one or more (e.g., fixed angle) limiting pins 134 that is fixedly attached to one or more connecting devices 128.

In some implementations, the arc-shaped first plate 129" may be directly attached (e.g., welded, soldered, adhered, and so forth) to the inner surface 121 of the sidewall portion 120 of the immersion cooling tank 102'. One or more rectangular-shaped second plates 130" are rotationally coupled to the arc-shaped first plate 129", e.g., using one or more connecting device(s) 128. Preferably, the second plates 130" is structured and arranged to (e.g., fully or partially) cover the opening or perforation 131 when sloshing occurs and force is applied to the underside of the second plates 130". Advantageously, the shapes of the first plate 129" and the second plates 130" may differ as long as the second plates 130" are capable of (e.g., fully or partially) covering the opening or perforation 131 when sloshing occurs.

Although the second plates 130" shown in FIG. 6D are rectangular in shape, this is done for illustrative purposes only. For example, in some variations, the second plates 130" may be tapered or pie-shaped to maximize the area that the second plate 130" covers on while not overlapping each other.

In some applications, the second plate 130" may be adapted to conjoin with the first plate 129" when a force applied to the (e.g., underside of the) second plate 130" exceeds a certain threshold. For example, when a force of a certain magnitude is applied to portions of the anti-sloshing device 127", the force may be of sufficient magnitude to cause the second plates 130" to rotate about the connecting device 128 until each second plate 130" touches or otherwise comes into physical contact with its respective first plate 129", causing the first plate 129" and the second plate 130" to conjoin. Those skilled in the art can appreciate that the plates 129", 130" may be manufactured in any arbitrary shape and size for applications with immersion cooling tanks 102' that are circular, rectangular, or other arbitrary shape.

As shown in FIGS. 7-10, one or more of the plates 129, 130 may contain openings or perforations 131, 131', or, more particularly, perforations 131, 131' may be formed in one or more of the plates 129, 130. The shapes of the perforations 131, 131' may be circles 131 (FIGS. 7 and 8), rectangles 131' (FIGS. 9 and 10), squares, elliptical, ovals, substantially circular, rounded rectangular, rounded square, and so forth. Moreover, as shown, for example, in FIGS. 9 and 10, the perforations 131, 131' may have different patterns and spacings between perforations 131, 131'. Indeed, the shapes, sizes, patterns, and distributions of the perforations 131, 131' may be formed in one or more of the plates 129, 130 in any arbitrary combination. Furthermore, when perforations 131, 131' are formed on both plates 129, 130, the position of the perforations 131, 131' of their corresponding plate 129, 130 may not overlap one another, may fully overlap, or may partially overlap one another.

Figure 11A:
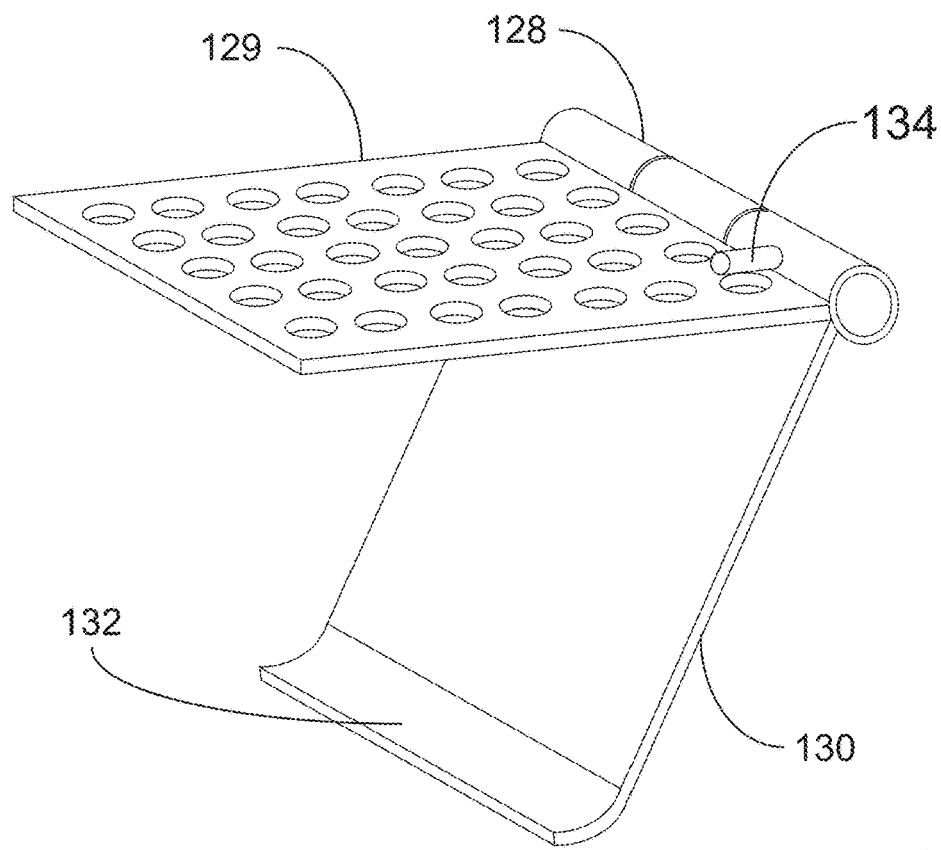
FIGS. 11A and 11B depict top isometric and side views, respectively, of an anti-sloshing device having a curved portion, in accordance with some embodiments of the present invention.
Figure 11B:
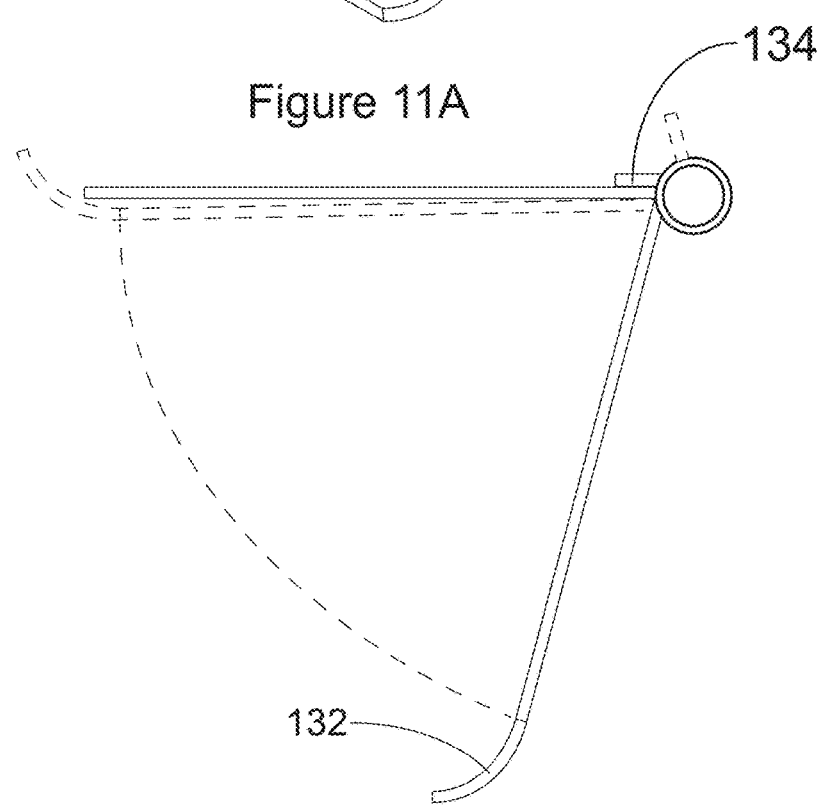

As shown in FIGS. 11A and 11B, in some implementations, one or more of the plates 129, 130 may include a curved portion 132. For example, in one implementation, the anti-sloshing device 127 may include a second plate with a curved portion 132, such that the second plate 130 is attached to the connecting device 128 on a proximal end and the curved portion 132 is integrated into the distal end of the second plate 130. Advantageously, this arrangement enables the second plate 130 to be installed at an acute angle that can still be pushed up by the upward force of heat transfer fluid when sloshing occurs. Moreover, the curved portion 132 provides better dynamics to the second plate 130 by providing an increased contact area to contact the heat transfer fluid 103 as it begins to slosh 150 in the immersion cooling tank 102. This larger surface area makes the anti-sloshing device 127 more sensitive to the forces of the sloshing 150, so that the second plate 130 with a curved portion 132 may begin to rotate about the connecting device 128 before a second plate 130 without a curved portion 132 would.

Figure 12:
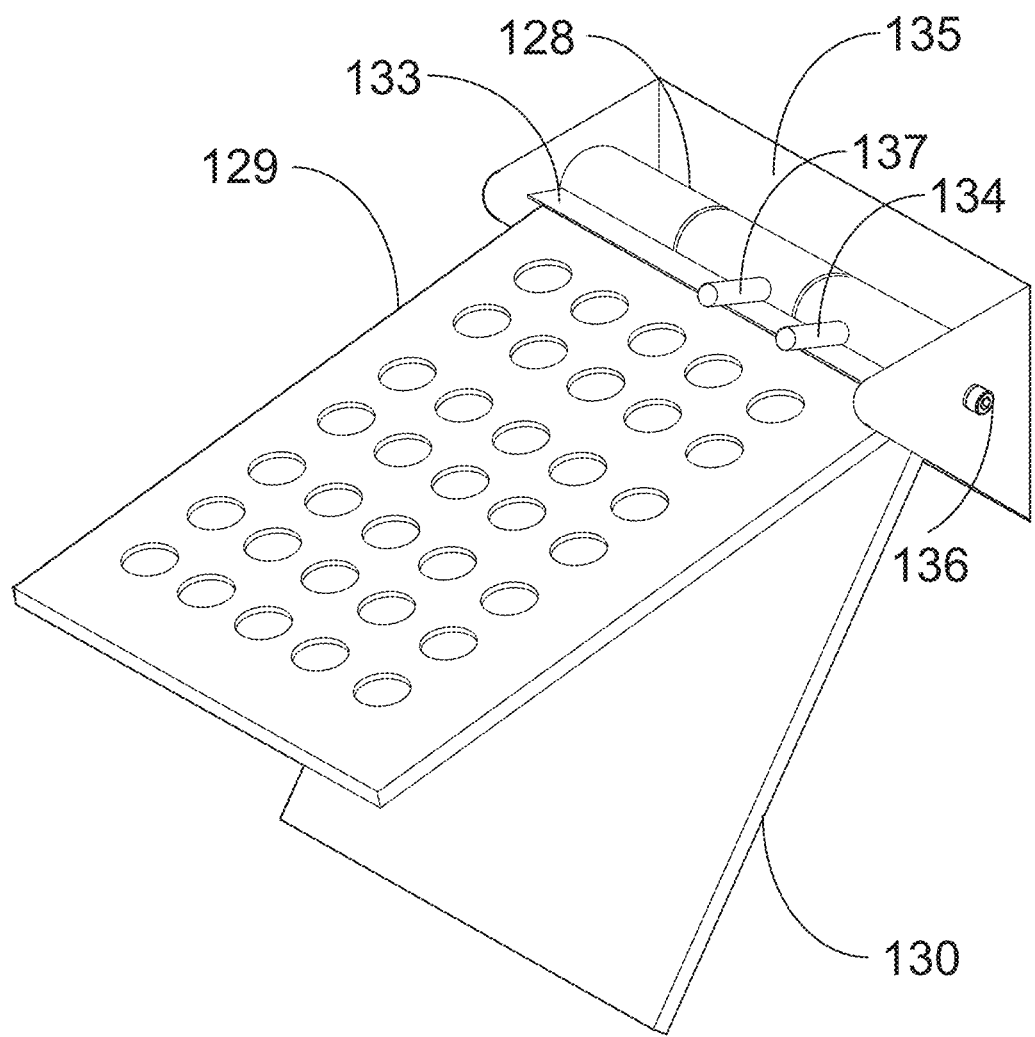
FIG. 12 depicts an isometric view of an anti-sloshing device with circular perforations formed in a first plate and having an adjustable mounting bracket, in accordance with some embodiments of the present invention.
Figure 13:
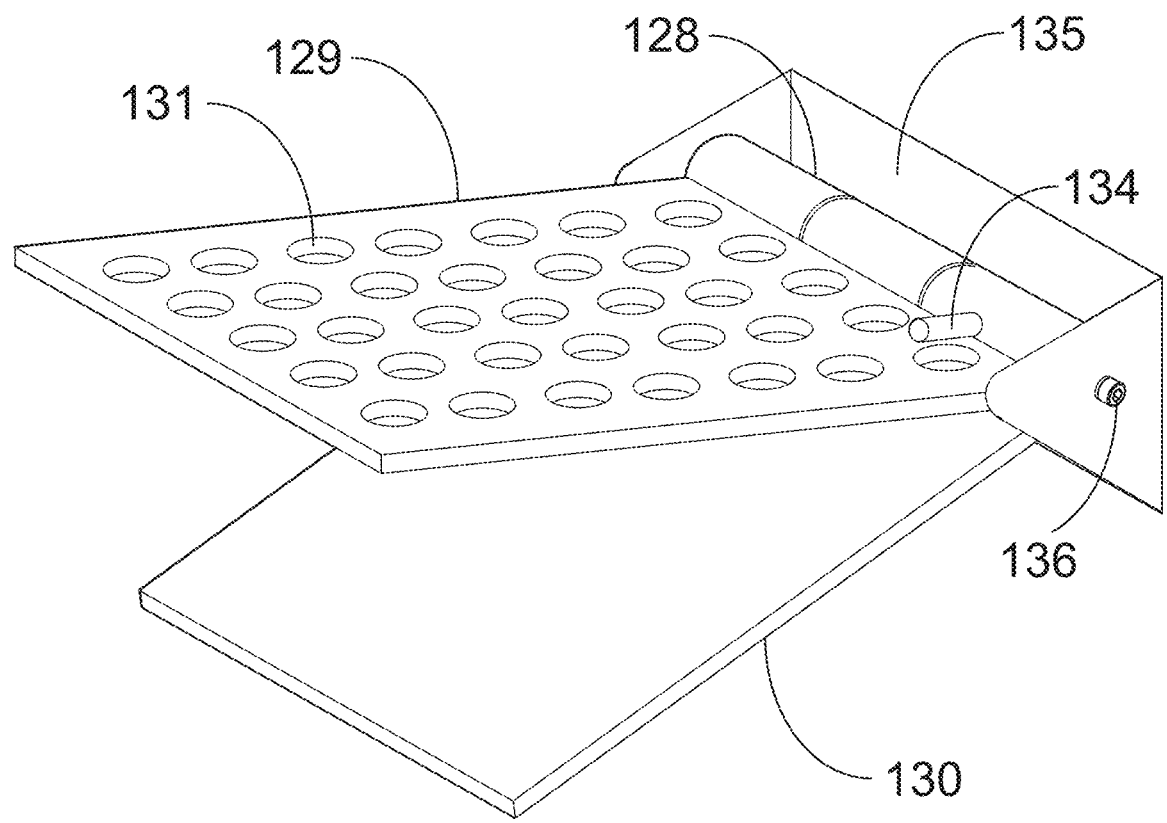
FIG. 13 depicts an isometric view of an anti-sloshing device with circular perforations formed in a first plate and having an adjustable mounting bracket, in accordance with some embodiments of the present invention.

In implementations in which both the first plate 129 and the second plate 130 are rotatable about the connecting device 128, as shown in FIGS. 12 and 13, the connecting device 128 may be rotatably attached to a mounting bracket 135 (e.g., using a screw pin 136). Moreover, when both plates 129, 130 are adapted to rotate, a stopping or arresting device 133 may be attached to the mounting bracket 135 to stop or arrest any further rotation of the first plate 129 and/or the conjoined first 129 and second plates 130. Advantageously, the mounting bracket 135 makes it is possible to change the orientation of the connecting device 128 and/or to remove the entire anti-sloshing device 127.

As shown in FIGS. 12 and 13, a first (e.g., fixed angle) limiting pin 134 may be fixedly attached to a first portion of the connecting device 128 (e.g., to a portion of the connecting device 128 that is adapted to rotate as the second plate 130 rotates) for the purpose of limiting or defining the angle formed between the stopping or arresting device 133 and the first plate 129. As shown in FIG. 13, a second (e.g., fixed angle) limiting pin 137 may also be fixedly attached to a second portion of the connecting device 128 (e.g., a portion of the connecting device 128 that does not rotate when the second plate 130 rotates and/or that rotates when the first plate 129 rotates) for the purpose of limiting or defining the angle formed between the stopping or arresting device 133 and the first plate 129.

Operation of the Anti-Sloshing Device

Having described various embodiments of anti-sloshing devices 127, immersion cooling tanks 102 containing anti-sloshing devices 127, and immersion cooling systems 100 including immersion cooling tanks 102 with anti-sloshing devices 127, operation of the device 127 will now be described. FIG. 4 shows an exemplary immersion cooling tank 102 in which an object 101 (e.g., a heat-generating electronic device), under normal operating conditions, is submerged within a heat transfer fluid 103. An anti-sloshing device 127 may be: installed above the level of the heat transfer fluid 103, partially immersed in the heat transfer fluid 103, or fully immersed in the heat transfer fluid 103. However, the anti-sloshing device 127 is most effective if it is installed above the surface level of the heat transfer fluid 103; although, the anti-sloshing device 127 is still functional if partially immersed or fully immersed in heat transfer fluid 103. In some implementations, the anti-sloshing device 127 may be installed in such a way that the first plate 129 is attached to the immersion cooling tank 102 (e.g., using a mounting bracket 135), so as to be oriented parallel or substantially parallel to the surface level of the heat transfer fluid 103. The second plate 130, at a proximal end, may be attached to the first plate 129, e.g., via the connecting device 128; while, at a distal end, the second plate 130 may be separated from the first plate 129 by an acute angle oriented at a declining angle, i.e., pointing generally in the direction of the surface level of the heat transfer fluid 103.

Heat transfer fluid 103 (e.g., a fluid dielectric) within the immersion cooling tank 102 absorbs heat generated and emitted by the object 101. When the heat absorbed by the heat transfer fluid 103 exceeds the boiling point of the heat transfer fluid 103, the heated fluid vaporizes (e.g., becomes a dielectric vapor 110). Under normal operating conditions, the dielectric vapor 110 passes through the perforations 131, 131' in the first 129 and/or second plates 130 and reaches the condensing device 104. Advantageously, the dielectric vapor 110 then condenses and flows back into the immersion cooling tank 102 as a liquid.

In special situations, e.g., when an earthquake happens or an excessive force is applied to the immersion cooling tank 102, vibrations having a very large amplitude may be transferred to the heat transfer fluid 103, which result in sloshing 150 of heat transfer fluid 103 in the immersion cooling tank 102. As shown in the shaded portion of FIG. 4, when sloshing 150 occurs, a portion(s) 160 of the object 101 is no longer submerged in the heat transfer fluid 103, while a portion(s) 170 of the sloshing 150 is forced upward, above the level of the anti-sloshing device 127. More specifically, sloshing heat transfer fluid 170 applies an upward force under the second plate 130 of the anti-sloshing device 127. The second plate 130, which may come into contact with or otherwise become coupled to the first plate 129, and the anti-sloshing device 127 as a whole, act as effective temporary baffles to dampen the magnitude of the sloshing 150, which prevents further sloshing of the heat transfer fluid 170 in the immersion cooling tank 102 in a vertical direction. Perforations 131, 131' formed in one or more of the plates 129, 130 increase the buffering effect since the sloshing heat transfer fluid 170 loses its kinetic energy while passing through the perforations 131, 131'. In some variations, the perforations 131, 131' may be structured and arranged on the plate(s) 129, 130 without any overlapping or partially overlapping. When the level of the heat transfer fluid 103 does not fluctuate (e.g., during normal operating conditions), gravity separates the rotatable second plate 130 from the first fixed plate 129 and, optionally, a limiting pin 134 arrests further separation, defining the angle between the first plate 129 and the second plate 130. Moreover, when the cyclical crest or peak of sloshing heat transfer fluid 170 transitions towards a trough, gravity and/or the drag force of the ebbing heat transfer fluid 103 cause the rotatable second plate 130 to separate from the first fixed plate 129. Optionally, the limiting pin 134 limits or restricts further separation of the second plate 130 from the first plate 129, returning the second plate 130 to its predetermined or desired fixed angle with respect to the first plate 129.

In instances in which the force applied on the second plate 130 by the sloshing heat transfer fluid 170 exceeds a certain threshold, the second plate 130 rotates upwards (i.e., towards the first plate 129) and then contacts or otherwise touches the rigid or partially rotatable first plate 129. When the first plate 129 and second plate 130 are conjoined as a result of this contact or touching, the conjoined assembly 127 acts as effective baffles to prevent further sloshing 150 and/or to diminish the existing sloshing 150 within the immersion cooling tank 102 in a vertical direction. In some variations, a curved portion 132 may be formed or attached to a distal end of the second plate 130 and may be configured, such that the second plate 130 may be disposed at an increased angle and may provide a longer stroke in comparison with a second plate 130 that does not have a curved portion 132. Advantageously, the curved portion 132 is adapted to increase the contact surface with the sloshing heat transfer fluid 150. The second plate 130 having a curved portion 132 can still be pushed up by the upward force of the heat transfer fluids 103 when sloshing 150 occurs.

As shown in FIG. 12, in some applications, if the first plate 129 is rotatable, the anti-sloshing device 127 may also include a rigid stopping device 133 that is structured and arranged to limit, effectively, the movement (i.e., the extent of the rotation) of the first plate 129. In this embodiment, both plates 129, 130 would rotate upwards until they arrested by the stopping device 133.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. An immersion cooling system comprising:
   an immersion cooling tank having an interior volume to contain a heat transfer fluid;
   an anti-sloshing device attached to the immersion cooling tank, the anti-sloshing device comprising:
      a hinge attached to a sidewall of the immersion cooling tank;
      a first plate having a first end and a second end opposite the first end, the first end of the first plate being fixedly or rotatably attached to the hinge, and the second end of the first plate extending into and partially across the interior volume of the immersion cooling tank; and
      a second plate having a first end and a second end opposite the first end, the first end of the second plate being rotatably attached to the hinge, and the second end of the second plate extending into and partially across the interior volume of the immersion cooling tank,
      wherein a plurality of openings are formed through at least one of the first plate and the second plate.

2. The system of claim 1, wherein the plurality of openings include a shape that is selected from the group consisting of circular, substantially circular, elliptical, oval, rectangular, rounded rectangular, square, and combinations thereof.

3. The system of claim 1 further comprising a curved portion attached to or formed by at least one of the first plate or the second plate.

4. The system of claim 3, wherein each of the first plate and the second plate is attached to the hinge at a respective proximal end and the curved portion is disposed at a respective distal end of the first plate or the second plate.

5. The system of claim 1, wherein the second plate is rotatable and further adapted to contact the first plate when an external force is applied to the second plate.

6. The system of claim 5, wherein the second plate is adapted to contact the first plate when the external force applied exceeds a threshold.

7. The system of claim 1 further comprising a stopping device to limit rotation of the second plate.

8. The system of claim 1, wherein the anti-sloshing device comprises a plurality of devices, each device comprising at least one hinge, a first plate, and a second plate, the plurality of devices attached to respective portions of the immersion cooling tank.

9. An immersion cooling tank having an inner surface and adapted to contain a heat transfer fluid for cooling an IT component, the immersion cooling tank comprising:
   an anti-sloshing device attached to a portion of the immersion cooling tank, the device comprising:
      a connecting device attached to a sidewall of the immersion cooling tank;
      a first plate having a first end and a second end opposite the first end, the first end of the first plate being fixedly or rotatably attached to the hinge, and the second end of the first plate extending into and partially across the interior volume of the immersion cooling tank, the first plate being oriented parallel or substantially parallel to a surface level of the heat transfer fluid; and
      a second plate having a first end and a second end opposite the first end, the first end of the second plate being rotatably attached to the hinge, and the second end of the second plate extending into and partially across the interior volume of the immersion cooling tank,
      wherein the first plate is mounted above the surface level of the heat transfer fluid.

10. The immersion cooling tank of claim 9, wherein a plurality of openings are formed through at least one of the first plate or the second plate.

11. The immersion cooling tank of claim 10, wherein the openings include a shape that is selected from the group consisting of circular, substantially circular, elliptical, oval, rectangular, rounded rectangular, square, and combinations thereof.

12. The immersion cooling tank of claim 9 further comprising a curved portion attached to or formed by at least one of the first plate or the second plate.

13. The immersion cooling tank of claim 12, wherein each of the first plate and the second plate is attached to the connecting device at a respective proximal end and the curved portion is disposed at a respective distal end of the first plate or the second plate.

14. The immersion cooling tank of claim 9, wherein the second plate is rotatable and further adapted to contact the first plate when an external force is applied to the second plate.

15. The immersion cooling tank of claim 14, wherein the second plate is adapted to contact the first plate when the external force applied exceeds a threshold.

16. The immersion cooling tank of claim 9 further comprising a stopping device to limit rotation of at least the first plate.

17. The immersion cooling tank of claim 9, wherein the anti-sloshing device comprises a plurality of devices, each device comprising at least one connecting device, a first plate, and a second plate, the plurality of devices attached to respective portions of the immersion cooling tank.

18. A method of minimizing sloshing of a heat transfer fluid in an immersion cooling tank, the method comprising:
   attaching an anti-sloshing device to a portion of an inner surface of the immersion cooling tank, the device comprising:
      a hinge attached to a sidewall of the immersion cooling tank;
      a first plate having a first end and a second end opposite the first end, the first end of the first plate being fixedly or rotatably attached to the hinge, and the second end of the first plate extending into and partially across the interior volume of the immersion cooling tank; and
      a second plate having a first end and a second end opposite the first end, the first end of the second plate being rotatably attached to the hinge, and the second end of the second plate extending into and partially across the interior volume of the immersion cooling tank, the second plate being adapted to conjoin with the first plate when a force applied to the second plate exceeds a certain threshold; and filling the immersion cooling tank with heat transfer fluid to a predetermined level.

19. The method of claim 18, wherein the predetermined level is at or below the attached anti-sloshing device.

* * * * *